United States Patent
Wang et al.

(10) Patent No.: US 7,242,030 B2
(45) Date of Patent: Jul. 10, 2007

(54) QUANTUM DOT/QUANTUM WELL LIGHT EMITTING DIODE

(75) Inventors: Te-Chung Wang, Hsinchu (TW);
Jung-Tsung Hsu, Hsinchu (TW);
Chang-Cheng Chuo, Hsinchu (TW);
Ching-En Tsai, Hsinchu (TW);
Chih-Ming Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/320,654

(22) Filed: Dec. 30, 2005

(65) Prior Publication Data

US 2006/0145137 A1 Jul. 6, 2006

(30) Foreign Application Priority Data

Dec. 30, 2004 (TW) .................. 93141513
Nov. 2, 2005 (TW) .................. 94138458

(51) Int. Cl.
*H01L 29/20* (2006.01)
(52) U.S. Cl. ............... 257/89; 257/84; 257/99; 257/100; 257/103; 257/E25.032; 257/E57.022; 362/84; 362/800
(58) Field of Classification Search ............. None
See application file for complete search history.

(56) References Cited

U.S. PATENT DOCUMENTS 6,720,584 B2 * 4/2004 Hata et al. .................. 257/98
2006/0208262 A1 * 9/2006 Sakuma et al. .............. 257/79

OTHER PUBLICATIONS

Tu et al., *Ultra-High-Density InGaN Quantum Dots Grown by Metalorganic Chemical Vapor Deposition*, 2004 The Japan Society of Applied Physics, vol. 43, No. 2B, 2004, pp. L264-L266.

* cited by examiner

*Primary Examiner*—Sue A. Purvis
*Assistant Examiner*—Scott R. Wilson
(74) *Attorney, Agent, or Firm*—Rabin & Berdo, P.C.

(57) ABSTRACT

A quantum dot/quantum well light emitting diode (LED) is provided with a LED at one side of a substrate, and a second light emitting layer and a third light emitting layer at the other side of the substrate. When a proper forward bias is applied to the LED to emit a first light by the first light emitting layer, the first light is used to excite the second light emitting layer and the third light emitting layer to generate the second light output and the third light output of different colors respectively. Then, the light output of a desired color can be generated by mixing the first light, the second light and the third light.

44 Claims, 7 Drawing Sheets

QUANTUM DOT/QUANTUM WELL LIGHT EMITTING DIODE

CROSS-REFERENCE TO RELATED APPLICATIONS

This non-provisional application claims priority under 35 U.S.C. § 119(a) on Patent Application No. 94138458 filed in Taiwan, R.O.C. on Nov. 2, 2005 and Application No. 93141513 filed in Taiwan, R.O.C. on Dec. 30, 2004, the entire contents of which are hereby incorporated by reference.

BACKGROUND OF THE INVENTION

1. Field of the Invention

The present invention relates to a Light Emitting Diode (LED), and more particularly to a phosphor-free quantum dot/quantum well LED.

2. Related Art

Light Emitting Diode (LED) is a semiconductor light emitting component. Different from the traditional incandescent bulb which illuminates by a high current applied to heat the filament, the LED only requires a low current to emit the equivalent light. LED is based on the fact that in semiconductor materials when electrons are binding with holes the energy released is revealed in the form of emitting light. Due to having the advantages of small volume, long lifespan, low driving voltage, low power consumption, quick response, excellent shock resistance and good monochromaticity and on the like, the LED is widely used in light emitting component, such as various electrical appliances, information board communication products. Depending on the control of the chip type and process, various homochromous lights can be obtained.

Due to its power-saving feature, the LED can be used as lighting equipment instead of bulbs in the future. But now the white LED can not be widely used because of its luminance and price; however, white LED will contribute to the booming of the LED industry. At present, most of the white LED products emit yellow light by stimulating the phosphor with a blue LED. These two lights, after being mixed, can give a visual impression of white light. As the luminance of the blue LED is improved gradually, the application of the white LED has a bright future in the lighting market.

The development of high luminance LED vitalizes the LED industry. Especially, the success of the development of blue, green LEDs improves the luminous efficiency gradually. At present, the luminance of the LED can be higher than that of several candles and is still improved progressively. Due to the progressing luminance of the blue light, the application of the white LEDs produced by coating phosphor will be widely used in the lighting market. However, it is very difficult to control the light emitted by a white LED to be pure white, as it is produced by mixing the blue and the yellow light; instead, the light is approximately white with cyan or yellow halation, i.e. having unequal color temperature.

Figure 1:
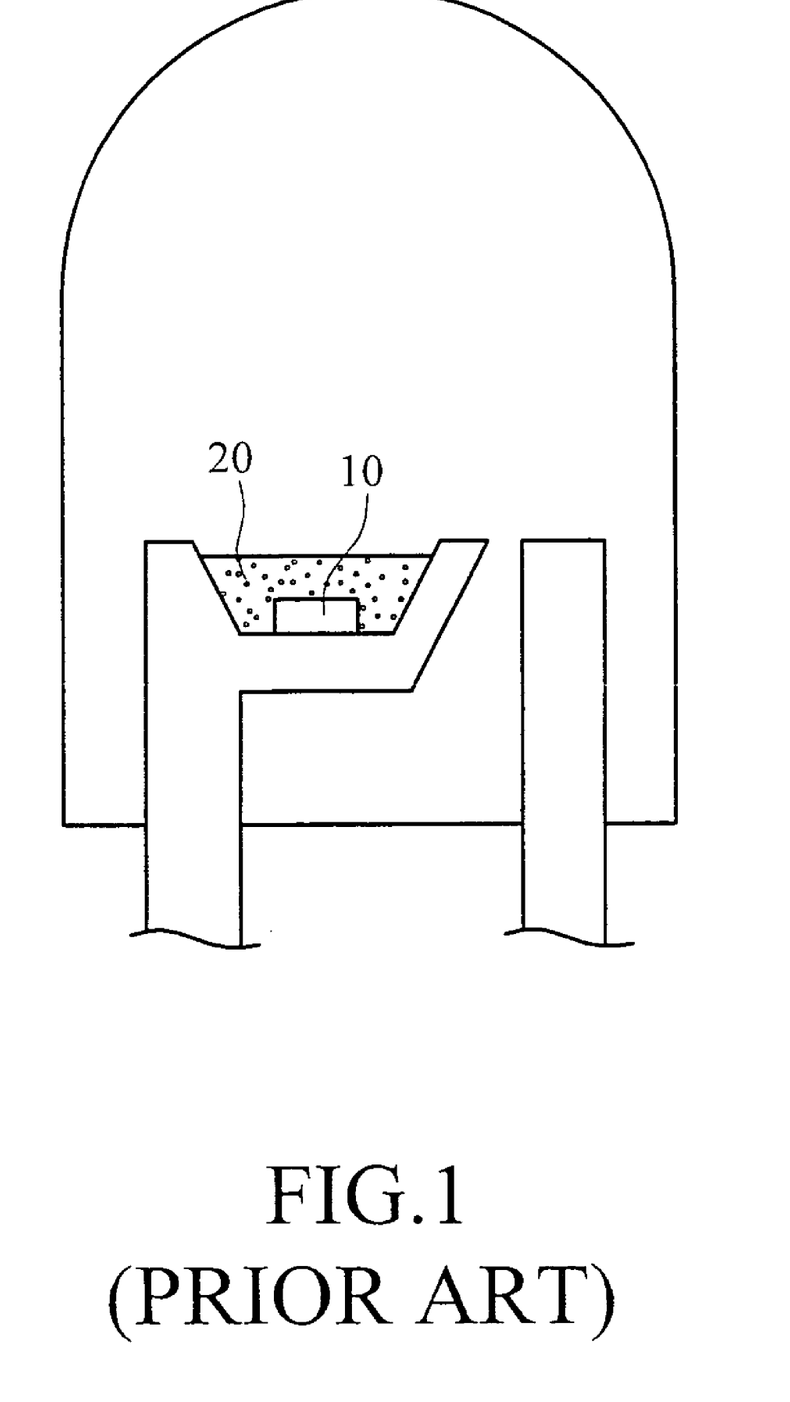
FIG. 1 is a schematic structural view of a conventional inorganic white LED.

Presently, the commercially available mature product is the inorganic white LED developed by Japanese Nishia Chemical Institute. Referring to FIG. 1, a schematic structure view is shown. A blue die 10 with a wavelength of 460 nanometer is coated with a layer of yttrium aluminum garnet phosphor 20 which is excited by the blue LED to produce a yellow light with a wavelength of 555 nanometer complementary with the blue light. Then, the yellow and blue light complementary with each other is mixed according to the lens principle to obtain the desired white light. In this way, the manufacture cost of a white LED is low and the structure of the power loop is simple.

This white LED mainly comprises blue die and phosphor. However, because the lifespan of a phosphor is short, the lifespan of a LED is limited. Furthermore, as the light emitted by the LED does not contain red light, red light cannot be emitted when irradiating red objects, thus causing poor color rendering index.

To improve poor color rendering index, a method of mixing the lights emitted by of red, blue, green LEDs respectively is proposed to produce a white emitting light source. However, since LEDs of different wavelengths are not in the same area, but separated from one another with a fixed distance, the problem of poor color rendering index still exists.

At present, the advanced technology employs two epitaxy materials which produce lights of different wavelengths to produce a white light source by wafer bonding or wafer fusion. However, because the process of wafer bonding is employed in producing the light source, which results in an absorption to the double-chip interface, the emitting efficiency will be reduced, and the technological requirements and cost are indirectly raised, and also the difficulty in the manufacture is increased and the product yield is reduced.

Therefore, it is the problem to be solved that how to develop a phosphor-free LED having the features of high color rendering index, long lifespan, low cost and so on.

SUMMARY OF THE INVENTION

In view of the aforementioned problem, the main object of the invention is to provide a quantum dot/quantum well LED with a LED at one side of a substrate and a second light emitting layer and a third light emitting layer disposed at the other side of the substrate. When a proper forward bias is applied to the N-type doped nitride layer and the P-type doped nitride layer in the LED, the light emitting layer emits a first light. The second light emitting layer and the third light emitting layer are excited by the first light generating the second light output and the third light output of different colors. Therefore, the light output of a desired color can be obtained by mixing the first light, the second light and the third light.

As desired, users can change the composing materials of the light emitting layer, the second light emitting layer and the third light emitting layer in the LED to produce lights of different colors. The light output of a desired color can be obtained by adjusting the combination of lights of different colors and in different proportions.

Because the quantum dot/quantum well LED utilizes the reaction of photon recycling to excite the second light emitting layer and the third light emitting layer to emit lights of different colors, its lifespan is not limited to the lifespan of the phosphor, therefore its lifespan is longer than a conventional white LED containing phosphor.

Furthermore, because the structure of the light emitting layer is produced on a substrate by epitaxy, compared with a conventional white light source which employs three red(R)/green(G)/blue(B) LEDs to mix lights, the volume or the area occupied can be reduced significantly,.

Also, the quantum dot/quantum well LED of the present invention emits lights of three different wavelengths (red, blue, green) in the same area; therefore, compared with the conventional light source which employs individual LEDs to mix lights, this LED has better color rendering index.

Furthermore, according to the present invention, the desired thin film structure grows layer by layer in the manner of epitaxy, so two epitaxy materials are not required to be bonded by wafer bonding to produce a white emitting light source. Therefore, neither the problem of the decrease of the emitting efficiency in the conventional technology, nor the problem of reliability caused by wafer bonding will occur.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 2:
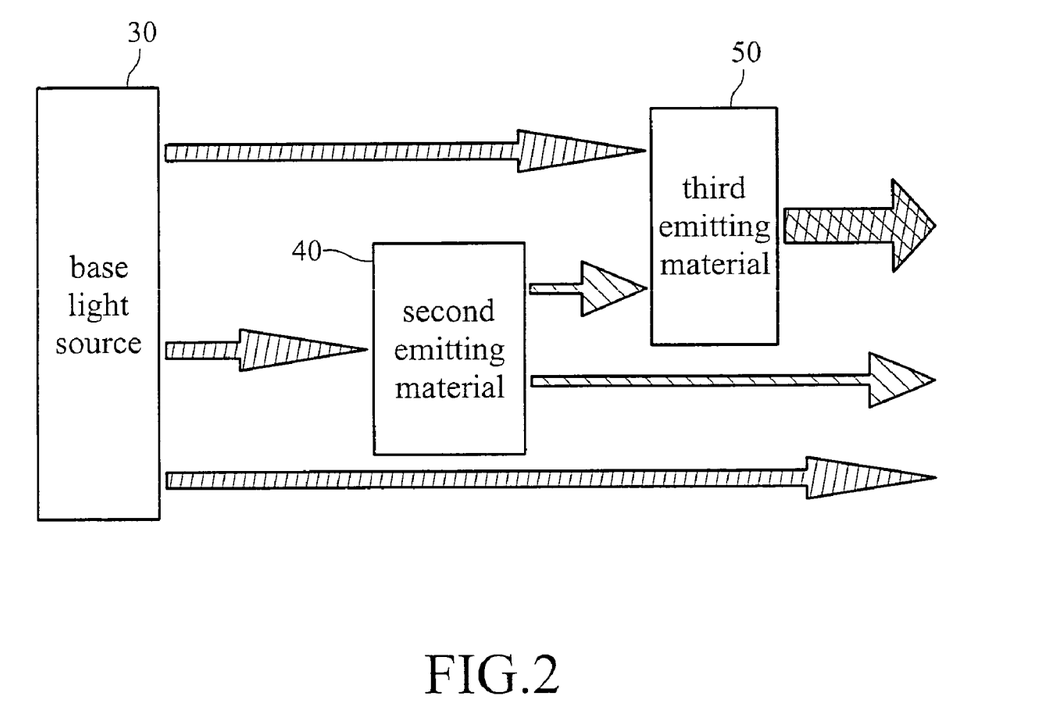
FIG. 2 is a schematic view of the reaction of photon recycling.

Referring to FIG. 2, the quantum dot/quantum well LED of this invention utilizes the reaction of photon recycling to excite a second emitting material 40 and a third emitting material 50 (the second emitting material 40 and the third emitting material 50 can absorb the wave band energy of the base light source 30 to emit lights of different colors) respectively with a portion of the light emitted by a base light source 30. Also, a portion of the light emitted by the second emitting material 40 can also be used to excite the third emitting material 50, and the light output of a desired color can be obtained by mixing the three lights of different colors emitted by the base light source 30, the second emitting material 40 and the third emitting material 50.

Figure 3A:
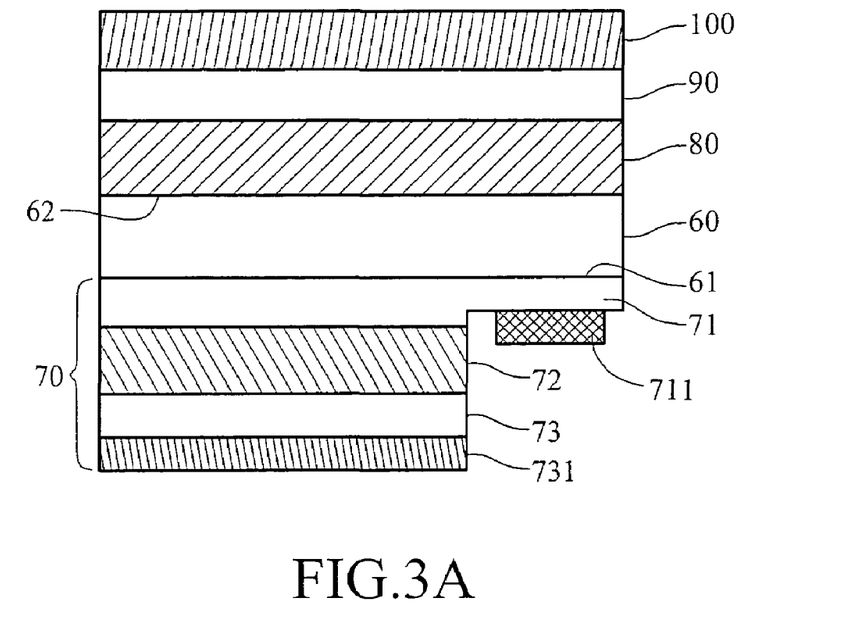
FIG. 3A is a schematic structural view of a quantum dot/quantum well LED according to the first embodiment of the present invention.

Referring to FIG. 3A, it is a schematic structural view of a quantum dot/quantum well LED according to the first embodiment of the present invention. The quantum dot/quantum well LED mainly comprises a substrate 60, a LED structure 70, a second light emitting layer 80, a spacer layer 90 and a third light emitting layer 100.

The substrate 60 includes a first surface 61 and a second surface 62. The material of the substrate 60 is selected from the group consisting of Sapphire substrate, Silicon (Si) substrate, Silicon carbide (SiC) substrate, Aluminum oxide ($Al_2O_3$) substrate, gallium nitrogen (GaN) substrate, Aluminum nitride (AlN) substrate, Gallium arsenide (GaAs) substrate, and Zinc oxide (ZnO) substrate etc., which is used for epitaxy after being polished.

The blue LED structure 70 is formed on the first surface 61 below the substrate 60, which mainly includes a N-type doped nitride layer 71, a P-type doped nitride layer 73, and a first light emitting layer 72 sandwiched between the N-type doped nitride layer 71 and the P-type doped nitride layer 73. The material of the first light emitting layer 72 is based on indium nitride or aluminum nitride, and its structure is a carrier confinement quantum well/quantum dot.

A N-type electrode 711 and a P-type electrode 731 are formed on the N-type doped nitride layer 71 and the P-type doped nitride layer 73 respectively, and the N-type electrode 711 and the P-type electrode 731 are formed on part of the surface of the N-type doped nitride layer 71 and the P-type doped nitride layer 73. In application, the N-type electrode 711 and the P-type electrode 731 are used to apply a proper forward bias on the N-type doped nitride layer 71 and the P-type doped nitride layer 73, so as to excite the first light emitting layer 72 to emit blue light.

The second light emitting layer 80 is formed on the second surface 62 of the substrate 60. The composing material of the second light emitting layer 80 is based on nitride, and its structure is a carrier confinement quantum dot/quantum well layer. The second light emitting layer 80 can absorb the blue light emitted by the first light emitting layer 72 to emit green light.

The spacer layer 90 is formed on the second light emitting layer 80. The composing material of the spacer layer 90 is also based on nitride. The spacer layer 90 is used to separate the second light emitting layer 80 and the third light emitting layer 100.

The third light emitting layer 100 is formed on the spacer layer 90. The composing material of the third light emitting layer 100 is also based on nitride, and its structure is a carrier confinement quantum dot/quantum well layer. The third light emitting layer 100 can absorb the blue light emitted by the first light emitting layer 72 and the green light emitted by the second light emitting layer 80 to emit red light.

When a proper forward bias is applied to the N-type doped nitride layer 71 and the P-type doped nitride layer 73 by the N-type electrode 711 and the P-type electrode 731, the first light emitting layer 72 can be excited to emit a first light output. The first light is blue. A portion of the first light will be emitted directly, while the rest is used to excite the second light emitting layer 80 and the third light emitting layer 100 respectively. A second light will be produced after the blue light is absorbed by the quantum dot/quantum well layer of the second light emitting layer 80. The second light is green. A third light will be produced after a portion of the blue light generated by the first light emitting layer 72 and a portion of the green light generated by the second light emitting layer 80 are absorbed by the quantum dot/quantum well layer of the third light emitting layer 100. The third light is red. Thus, a desired white light output can be obtained by mixing the first light (blue), the second light (green) and the third light (red), and the N-type electrode 711 and the P-type electrode 731 can be used to reflect the first light, the second light and the third light.

Of course, the users can change the composing materials of the first light emitting layer 72, the second light emitting layer 80 and the third light emitting layer 100 as desired to produce the lights of different colors. Then, the light output of a desired color can be obtained by adjusting the combination of lights of different colors and in different proportions.

Figure 3B:
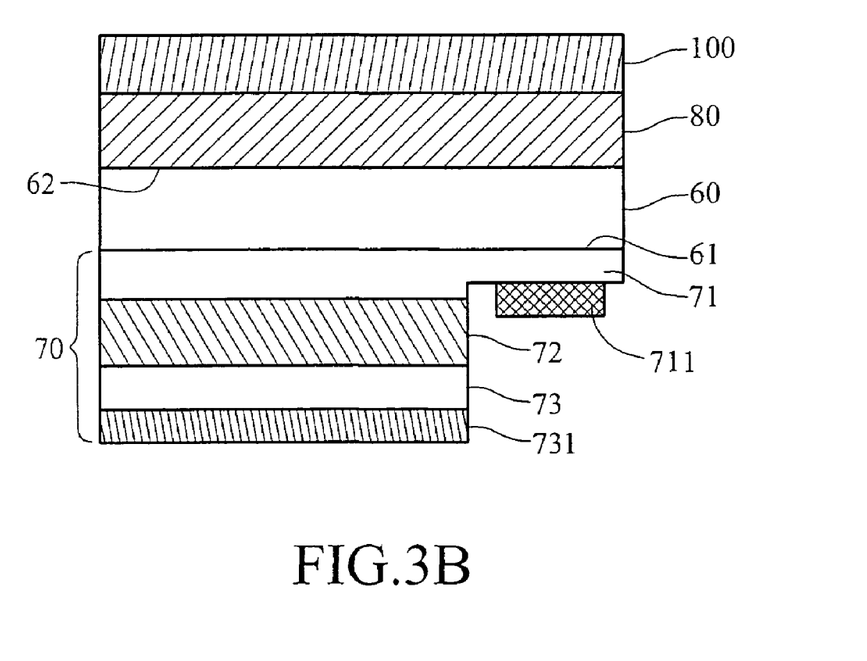
FIG. 3B is a schematic structural view of a quantum dot/quantum well LED according to the second embodiment of the present invention.

Referring to FIG. 3B, it is a schematic structural view of a quantum dot/quantum well LED according to the second embodiment of the present invention. The structure of the second embodiment is similar to that of the first embodiment, only omitting the spacer layer 90, but it also can achieve the same illumination effect.

Figure 4A:
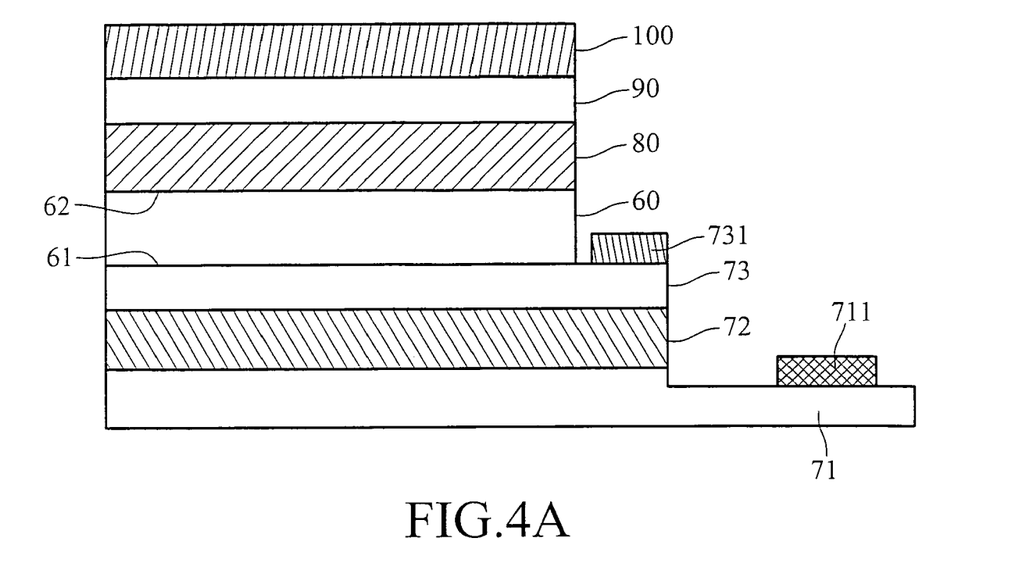
FIG. 4A is a schematic structural view of a quantum dot/quantum well LED according to the third embodiment of the present invention.

Referring to FIG. 4A, it is a schematic structural view of a quantum dot/quantum well LED according to the third embodiment of the present invention. The structure of the third embodiment is similar to that of the first embodiment, but the structure of the blue LED structure 70 is opposite to that of the first embodiment. In the above first embodiment, the method for manufacturing the LED structure 70 is to form the N-type doped nitride layer 71, the first light emitting layer 72 and the P-type doped nitride layer 73 on the first surface 61 of the substrate 60 sequentially. While in the second embodiment, the method for manufacturing the LED structure 70 is to form the P-type doped nitride layer 73, the first light emitting layer 72 and the N-type doped nitride layer 71 on the first surface 61 of the substrate 60 sequentially. The structure of the LED 70 is also used to excite the first light of the second light emitting layer 80 and the third light emitting layer 100. The first light is blue.

A portion of the first light will be output directly, while the rest is used to excite the second light emitting layer 80 and the third light emitting layer 100 respectively. A second light will be generated after the blue light is absorbed by the quantum dot/quantum well layer of the second light emitting layer 80. The second light is green. A third light will be generated after a portion of the blue light generated by the first light emitting layer 72 and a portion of the green light generated by the second light emitting layer 80 are absorbed by the quantum dot/quantum well layer of the third light emitting layer 100. The third light is red. Thus, a desired white light output can be obtained by mixing the first light (blue), the second light (green) and the third light (red).

Figure 4B:
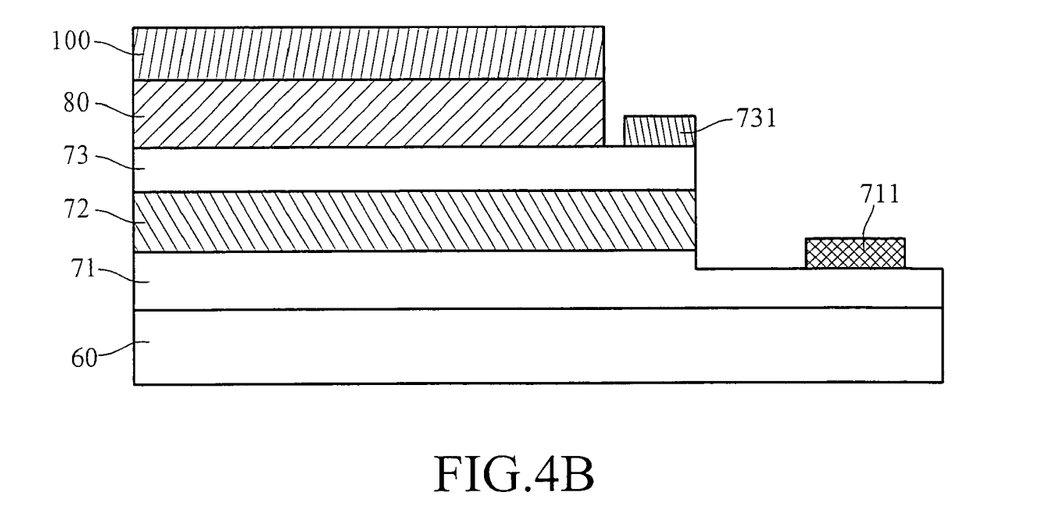
FIG. 4B is a schematic structural view of a quantum dot/quantum well LED according to the fourth embodiment of the present invention.

Referring to FIG. 4B, it is a schematic structural view of a quantum dot/quantum well LED according to the fourth embodiment of the present invention. The structure of the fourth embodiment is similar to that of the third embodiment, also omitting the spacer layer 90 and can also achieve the same illumination effect.

Figure 5A:
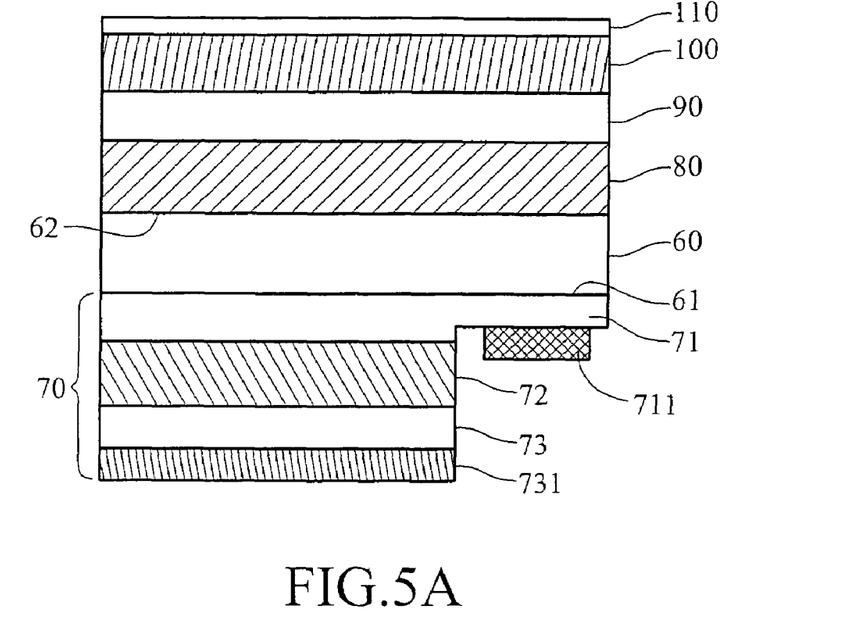
FIG. 5A is a schematic structural view of a quantum dot/quantum well LED according to the first embodiment with an additional reflective layer.

Referring to FIG. 5A, if the first light emitted by the LED structure 70 is designed to be a light in the wavelength range of ultraviolet. To avoid the leakage of ultraviolet, a reflective layer 110 can be added to the third light emitting layer 100 to reflect ultraviolet and also a structure like a Fabry-Perot resonant cavity can be formed to improve the light conversion efficiency. If another reflective layer (not shown) is disposed at the other side, it will achieve a better effect.

The reflective layer 110 can be a distributed Bragg reflector (DBR) or quarter wavelength Bragg stack, and it can also be an omni-directional reflection coating produced by optical coating.

Because the omni-directional reflection coating is produced by optical coating, the material and thickness of the coating can be controlled according to the desired optical reflective effect, so that only the light of the first light wavelength is reflected instead of the second light or the third light. Moreover, the omni-directional reflection coating can be designed to have high reflectivity directed to the beam emergence angles and different electric field polarizations of a specific LED. The omni-directional reflection coating is manufactured by optical coating, for example, sputtering, E-gun, chemical vapor deposition (CVD) etc. or nanotechnolog, such as self assembling, sol-gel and on the like. By depositing more than one type of high reflective index material and more than one type of low reflective index material on the surface of a substrate successively an omni-directional reflection coating can reflect ultraviolet of a specific wavelength in all directions, and the visible light source of the second light and the third light can penetrate through the film and be sent out.

This high-reflective material is selected from the group consisting of Titanium oxide ($TiO_2$), Tantalum oxide ($Ta_2O_5$), Niobium oxide ($Nb_2O_5$), Cerium oxide ($CeO_2$), zinc sulfide (ZnS), and mixtures thereof, for a thin film deposition. This low-reflective material is selected form the group consisting of free Silicon oxide ($SiO_2$) and Magnesium fluoride ($MgF_2$), or the combination thereof, for a thin film deposition.

In another aspect, a short wave pass filter can also be added to the light-emitting surface of the LED structure 70, to increase the emission measure of the LED structure 70, and the repetition of the excitement of the ultraviolet, and to prevent the second light or the third light from being fed back into the LED structure 70. Furthermore, above the reflective layer 110 as it is the emitting end for the second light and the third light, the optical elements such as diffractive optical element (DOE), dome lens, microlens, long wave pass filter or anti-reflection coating can be made on its surface, so as to increase the luminance and directivity of the visible light.

As shown in the FIGS, the excited light is the second light and the third light, which fall in the wavelength range of green and red respectively, as mentioned above. If the white light is desired, an additional light emitting layer can be provided to emit light in the wavelength range of blue, and the white light is them emitted after being mixed(not shown).

Figure 5B:
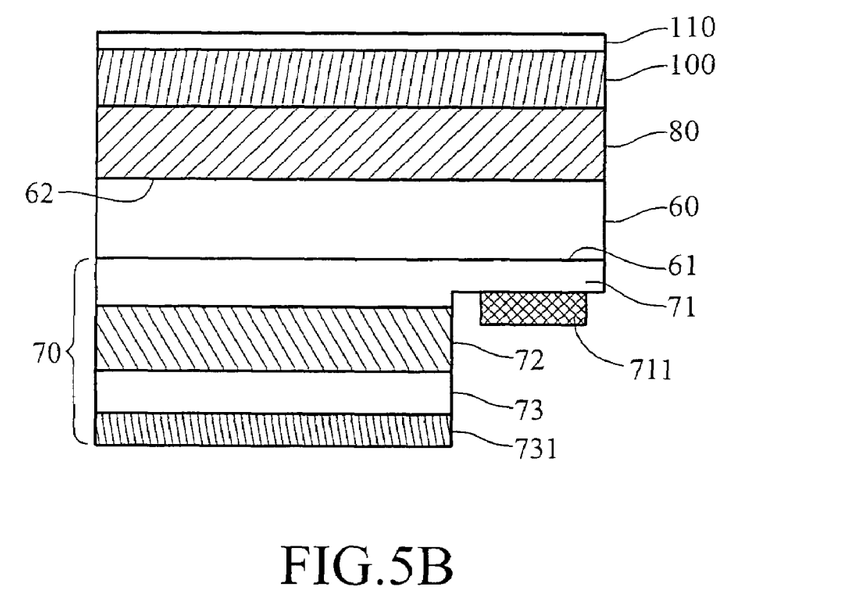
FIG. 5B is a schematic structural view of a quantum dot/quantum well LED according to the second embodiment with an additional reflective layer.
Figure 6A:
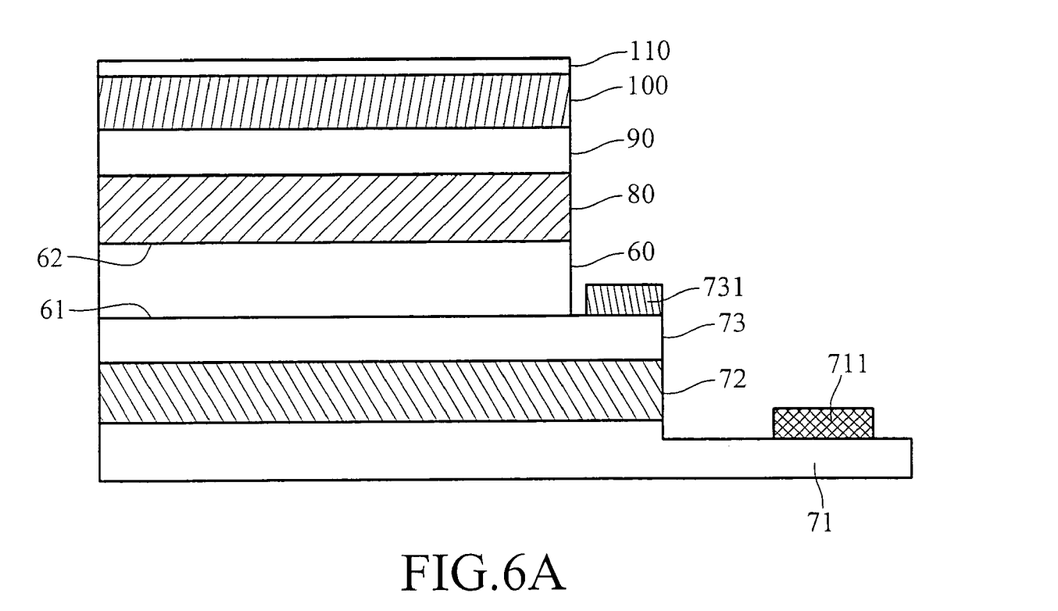
FIG. 6A is a schematic structural view of a quantum dot/quantum well LED according to the third embodiment with an additional reflective layer.
Figure 6B:
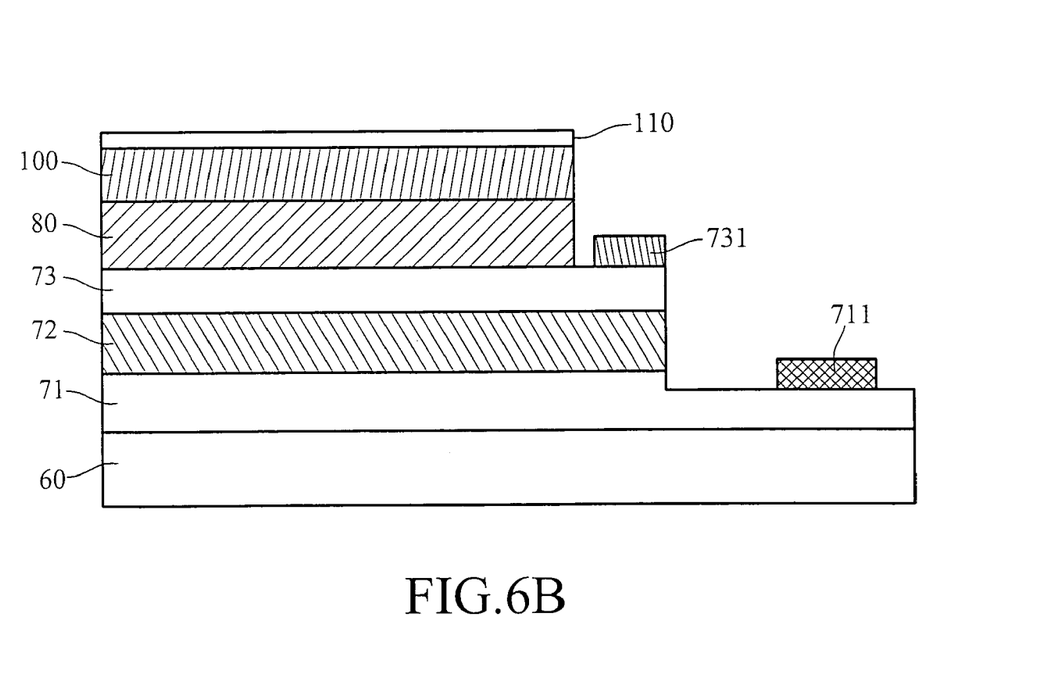
FIG. 6B is a schematic structural view of a quantum dot/quantum well LED according to the fourth embodiment with an additional reflective layer.
Figure 7:
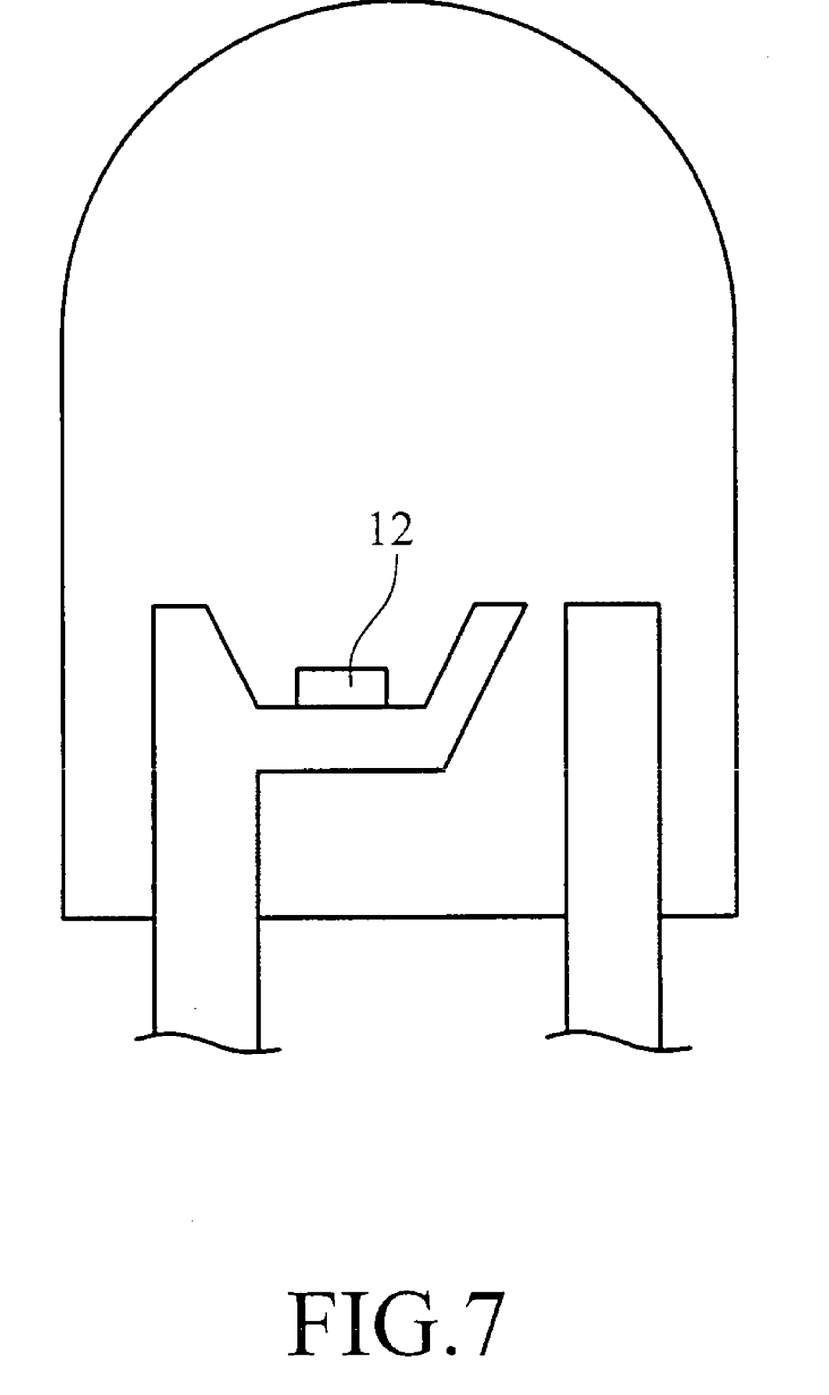
FIG. 7 is an application view of a quantum dot/quantum well LED according to the present invention.

Referring to FIG. 5B, it is similar to the aforementioned aspects, only omitting the spacer layer 90, which can also achieve the same illumination effect. Referring to FIGS. 6A, 6B, they are also similar to the third and fourth embodiments including the variation of the reflective layer 110, which will not be illustrated herein. As is shown in FIG. 7, in application, the quantum dot/quantum well LED 12 of the present invention is phosphor-free. The ultraviolet leakage will not occur.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A quantum dot/quantum well light emitting diode (LED), comprising:
   a substrate having a first surface and a second surface;
   a LED structure disposed on the first surface of the substrate, the LED structure having a N-type doped nitride layer formed on the first surface, a P-type doped nitride layer and a first light emitting layer sandwiched between these two nitride layers;
   a second light emitting layer disposed on the second surface; and
   a third light emitting layer disposed on the second light emitting layer;
   wherein, once a proper forward bias is applied to the N-type doped nitride layer and the P-type doped nitride layer, the first light emitting layer is excited to emit a first light output, while a portion of the first light is used to excite the second light emitting layer and the third light emitting layer respectively to generate a second light and a third light output; the second light can also be used to excite the third light emitting layer, and the light output of a desired color is generated by mixing the first light, the second light and the third light.

2. The quantum dot/quantum well LED according to claim 1, further comprising a spacer layer sandwiched between the second light emitting layer and the third light emitting layer.

3. The quantum dot/quantum well LED according to claim 1, further comprising a N-type electrode and a P-type electrode, the N-type electrode being connected to the N-type doped nitride layer, while the P-type electrode being connected to the P-type doped nitride layer, applying a proper forward bias to the N-type doped nitride layer and the P-type doped nitride layer by applying voltage on the N-type electrode and the P-type electrode.

4. The quantum dot/quantum well LED according to claim 3, wherein the N-type electrode and the P-type electrode are formed on a part of the surfaces of the N-type doped nitride layer and the P-type doped nitride layer respectively, for reflecting the first light, the second light and the third light.

5. The quantum dot/quantum well LED according to claim 1, wherein the P-type doped nitride layer is formed on the first light emitting layer of the substrate.

6. The quantum dot/quantum well LED according to claim 1, wherein the substrate is selected from the group consisting of Sapphire substrate, Silicon (Si) substrate, Silicon carbide (SiC) substrate, Aluminum oxide ($Al_2O_3$) substrate, gallium nitrogen (GaN) substrate, Aluminum nitride (AlN) substrate, Gallium arsenide (GaAs) substrate, Zinc oxide (ZnO) substrate, and mixtures thereof.

7. The quantum dot/quantum well LED according to claim 1, wherein the material of the first light emitting layer includes indium nitride, while its structure is a carrier confinement quantum well/quantum dot.

8. The quantum dot/quantum well LED according to claim 1, wherein the material of the second light emitting layer and the third light emitting layer includes nitride, and its structure is a carrier confinement quantum well/quantum dot.

9. The quantum dot/quantum well LED according to claim 1, wherein the wavelength of the first light falls in the wavelength range of blue light.

10. The quantum dot/quantum well LED according to claim 1, wherein the wavelengths of the second light and the third light fall in the wavelength range of green and red light respectively, and the desired white light output is generated by mixing the first light, the second light and the third light.

11. The quantum dot/quantum well LED according to claim 1, wherein the wavelength of the first light falls in the wavelength range of ultraviolet.

12. The quantum dot/quantum well LED according to claim 11, further comprising a reflective layer to reflect the ultraviolet.

13. The quantum dot/quantum well LED according to claim 12, wherein the reflective layer is a distributed Bragg reflector (DBR).

14. The quantum dot/quantum well LED according to claim 12, wherein the reflective layer is a quarter wavelength Bragg stack.

15. The quantum dot/quantum well LED according to claim 12, wherein the reflective layer is an omni-directional reflection coating formed by optical coating, and is produced by more than one high refractive index material and more than one low refractive index material by optical coating.

16. The quantum dot/quantum well LED according to claim 15, wherein the high refractive index material is selected from the group consisting of Titanium oxide ($TiO_2$), Tantalum oxide ($Ta_2O_5$), Niobium oxide ($Nb_2O_5$), Cerium oxide ($CeO_2$), zinc sulfide (ZnS), and mixtures thereof.

17. The quantum dot/quantum well LED according to claim 15, wherein the low refractive index material is selected from the group consisting of Silicon oxide ($SiO_2$), Magnesium fluoride ($MgF_2$), and mixtures thereof.

18. The quantum dot/quantum well LED according to claim 12, wherein the reflective layer further comprises a diffractive optical element thereon.

19. The quantum dot/quantum well LED according to claim 12, wherein the reflective layer further comprises a dome lens thereon.

20. The quantum dot/quantum well LED according to claim 12, wherein the reflective layer further comprises a microlens thereon.

21. The quantum dot/quantum well LED according to claim 12, wherein the reflective layer further comprises a long wave pass filter.

22. The quantum dot/quantum well LED according to claim 12, wherein the reflective layer further comprises an anti-reflection coating.

23. The quantum dot/quantum well LED according to claim 1, wherein the surface of the LED structure further comprises a short wave pass filter.

24. A quantum dot/quantum well light emitting diode (LED), comprising:
   a substrate;
   a LED structure disposed on the a first surface of the substrate, the LED structure having a N-type doped nitride layer, a P-type doped nitride layer and a first light emitting layer sandwiched between these two nitride layers;
   a second light emitting layer disposed on the P-type doped nitride layer;
   a spacer layer disposed on the second light emitting layer; and
   a third light emitting layer disposed on the spacer layer;
   wherein, once a proper forward bias is applied to the N-type doped nitride layer and the P-type doped nitride layer, the first light emitting layer is excited to emit a first light output having wavelength in the range of ultraviolet, while a portion of the first light is used to excite the second light emitting layer and the third light emitting layer respectively to generate a second light and a third light output; the second light can also be used to excite the third light emitting layer, and the light output of a desired color is generated by mixing the first light, the second light and the third light.

25. The quantum dot/quantum well LED according to claim 24, further comprising a N-type electrode and a P-type electrode, the N-type electrode being connected to the N-type doped nitride layer, while the P-type electrode being connected to the P-type doped nitride layer, applying a proper forward bias to the N-type doped nitride layer and the P-type doped nitride layer by applying voltage on the N-type electrode and the P-type electrode.

26. The quantum dot/quantum well LED according to claim 24, wherein the N-type doped nitride layer is formed on the substrate.

27. The quantum dot/quantum well LED according to claim 24, wherein the P-type doped nitride layer is formed on the first light emitting layer.

28. The quantum dot/quantum well LED according to claim 24, wherein the substrate is selected from the group consisting of Sapphire substrate, Si substrate, SiC substrate, $Al_2O_3$ substrate, GaN substrate, AlN substrate, GaAs substrate, ZnO substrate, and mixtures thereof.

29. The quantum dot/quantum well LED according to claim 24, wherein the material of the first light emitting layer comprises indium nitride, while its structure is a carrier confinement quantum well/quantum dot.

30. The quantum dot/quantum well LED according to claim 24, wherein the material of the second light emitting layer and the third light emitting layer includes nitride, while its structure is a carrier confinement quantum well/quantum dot.

31. The quantum dot/quantum well LED according to claim 24, wherein the wavelength of the first light falls in the wavelength range of blue light.

32. The quantum dot/quantum well LED according to claim 24, wherein the wavelengths of the second light and the third light fall in the wavelength range of green light and red light respectively, and the desired white light output is generated by mixing the first light, the second light and the third light.

33. The quantum dot/quantum well LED according to claim 24, further comprising a reflective layer to reflect the ultraviolet.

34. The quantum dot/quantum well LED according to claim 33, wherein the reflective layer is a distributed Bragg reflector (DBR).

35. The quantum dot/quantum well LED according to claim 33, wherein the reflective layer is a quarter wavelength Bragg stack.

36. The quantum dot/quantum well LED according to claim 33, wherein the reflective layer is an omni-directional reflection coating formed by optical coating, and is produced by more than one high refractive index material and more than one low refractive index material by optical coating.

37. The quantum dot/quantum well LED according to claim 36, wherein the high refractive index material is selected from the group consisting of $TiO_2$, $Ta_2O_5$, $Nb_2O_5$, $CeO_2$ and ZnS, or combination thereof.

38. The quantum dot/quantum well LED according to claim 36, wherein the low refractive index material is selected from the group consisting of $SiO_2$, $MgF_2$, and mixtures thereof.

39. The quantum dot/quantum well LED according to claim 33, wherein the reflective layer further comprises a diffraction optical element thereon.

40. The quantum dot/quantum well LED according to claim 33, wherein the reflective layer further comprises a dome lens thereon.

41. The quantum dot/quantum well LED according to claim 33, wherein the reflective layer further comprises a microlens thereon.

42. The quantum dot/quantum well LED according to claim 33, wherein the reflective layer further comprises a long wave pass filter.

43. The quantum dot/quantum well LED according to claim 33, wherein the reflective layer further comprises an anti-reflection coating.

44. The quantum dot/quantum well LED according to claim 24, wherein the surface of the LED structure further comprises a short wave pass filter.

* * * * *